US008977521B2

(12) United States Patent  
Angevine et al.

(10) Patent No.: US 8,977,521 B2
(45) Date of Patent: Mar. 10, 2015

(54) CREATING AND LINKING 3D SPATIAL OBJECTS WITH DYNAMIC DATA, AND VISUALIZING SAID OBJECTS IN GEOGRAPHIC INFORMATION SYSTEMS

(75) Inventors: Greg Angevine, Calgary (CA); James Cuff, Calgary (CA)

(73) Assignee: Cube Lease Inc., Calgary, Alberta (CA)

( * ) Notice: Subject to any disclaimer, the term of this patent is extended or adjusted under 35 U.S.C. 154(b) by 65 days.

(21) Appl. No.: 13/882,984

(22) PCT Filed: Nov. 1, 2011

(86) PCT No.: PCT/CA2011/001212
§ 371 (c)(1),
(2), (4) Date: May 23, 2013

(87) PCT Pub. No.: WO2012/058754
PCT Pub. Date: May 10, 2012

(65) Prior Publication Data
US 2013/0238290 A1   Sep. 12, 2013

Related U.S. Application Data

(60) Provisional application No. 61/408,713, filed on Nov. 1, 2010.

(51) Int. Cl.
*G06F 17/50* (2006.01)
*G06T 17/05* (2011.01)
(Continued)

(52) U.S. Cl.
CPC ............... *G06F 17/50* (2013.01); *G06T 17/05* (2013.01); *G06F 17/30241* (2013.01); *G06Q 50/16* (2013.01)
USPC ............................................................ 703/1

(58) Field of Classification Search
CPC ... G06F 17/30241; G06F 17/50; G06Q 50/16; G06T 17/05
USPC ............................................................ 703/1
See application file for complete search history.

(56) References Cited

U.S. PATENT DOCUMENTS 6,496,189 B1 * 12/2002 Yaron et al. ................... 345/428
7,353,114 B1   4/2008 Rohlf et al.
(Continued)

FOREIGN PATENT DOCUMENTS

| WO | 03-100360 | 12/2003 |
| WO | 2005-092676 | 10/2005 |
| WO | 2011-048518 | 4/2011 |

OTHER PUBLICATIONS

International Search Report Dated Jan. 30, 2012, 13 pages.
(Continued)

*Primary Examiner* — Aniss Chad

(57) ABSTRACT

A method and system of creating and linking 3D spatial objects with dynamic data, and visualizing said objects in geographic information systems (GIS) that includes a front end for a user interface, a database at the back end, and an application layer which processes the data sent between interface and database. A method of generating and uploading Keyhole Markup Language (KML) rings is disclosed. Furthermore, a user specifies a search location, and is shown a view of the available space indicated on the buildings by KML code which is assembled from the database by the system. A method for creating, linking and displaying a three-dimensional spatial object is also disclosed, as well as a method of generating a visual flight between several geographical points, showing the KML structures during the flight. Lastly, a method of showing a cardinal view from a floor of a building in a GIS is disclosed.

10 Claims, 17 Drawing Sheets

(51) Int. Cl.
*G06F 17/30* (2006.01)
*G06Q 50/16* (2012.01)

(56) References Cited

U.S. PATENT DOCUMENTS

| | | | |
|---|---|---|---|
| 7,746,343 | B1 | 6/2010 | Charaniya et al. |
| 7,933,395 | B1 * | 4/2011 | Bailly et al. ............. 379/201.04 |
| 8,676,001 | B2 * | 3/2014 | Brucher et al. ............... 382/306 |
| 8,744,214 | B2 * | 6/2014 | Snavely et al. ............... 382/284 |
| 2002/0035432 | A1 | 3/2002 | Kubica et al. |
| 2007/0107371 | A1 | 5/2007 | Plocher et al. |
| 2010/0250109 | A1 | 9/2010 | Johnston et al. |
| 2012/0213416 | A1 * | 8/2012 | Lorimer et al. ............... 382/113 |

OTHER PUBLICATIONS

International Preliminary Report on Patentability dated Jan. 3, 2013, 10 pages.

Informal Communication with the Applicant dated Nov. 9, 2012, 3 pages.

"Stacking Plans" RE BackOffice, Marketing Services, Jun. 27, 2009, [retrieved on Nov. 23, 2011], Retrieved from <http://web.archive.org/web/20090627085113 http://www.reabkoffice.com/stacking$_{13}$plans.html>.

"Overview", "Stacking Plans" and "renderings" pages, Real Estate Plans & Maps, Virtual Images, Aug. 20, 2008, [retrieved on Nov. 23, 2011], Retrieved from <http://web.archive.org/web/20080820043259/http://replans.com/overview.html, http://web.archive.org/web/20080820044223/http://replans.com/stacking.html, and http://web.archive.org/web/20080820043340/http://replans.com/renderings.html>.

"KLM 2.1 Reference—An OGC Best Practice", Open Geospatial Consortium Inc., Editor: Carl Reed on behalf of Google Earth staff, Version: 0.0.9, pp. i-x and 1-104, May 2, 2007.

* cited by examiner

Figure 5A

| Stage 1: KML Ring Generation |
|---|
| Creation of KML locations (lat, long, alt) that correspond to a path at a buildings highest point that represents the external footprint for the building. |

1010 — 1. Analyst loads KML file indicating by using place marks what buildings require rings to be generated.

1020 — 2. Analyst identifies the address of the building indicated by the place mark.

1030 — 3. Analyst using GIS, generates a base ring for the building in question. This process uses a series of points (lat, long, alt) to represent a point on the ring. This set of points serves as the basis of the KML rings. This is the base ring.

1040 — 4. Base ring is then elevated to the correct altitude for the building.

1050 — 5. The KML representing this ring is then saved with the name of the Building identified in step 2.

| Stage 2: KML Ring Upload |
|---|
| KML files that have been generated by Analysts are uploaded and imported into the Data system. |

1110 — 1. Analyst navigates to the data administration area of which this area holds all the tools required to do data import, creation and validation.

1120 — 2. Analyst will use the Upload KML process for the initial load of KML into the system.

1130 — 3. Select from a dropdown the correct Submarket for the building to be uploaded.

1140 — 4. Analyst will then locate the KML file they wish to upload, and process into the data system.

1150 — 5. The number of floors for the building to be uploaded are entered into the appropriate field.

1160 — 6. Analyst using the GIS positions a "camera" (view of the building) to set coordinates that will be used as the default view of the building being uploaded.

1170 — 7. Analyst submits building and values for back end processing.

Figure 5B

Stage 3: Cube Lease System Processing
Analyst submitted information is parsed and stored in back end data tables.

1210 — 1. Uploaded KML file is stored in a temporary folder location within the servers.

1220 — 2. Successful upload of KML file initiates the parsing process.

1230 — 3. Building address is stripped from the KML file and inserted into the DB.

1240 — 4. Coordinates for all points representing the ring are parsed from KML file.

1250 — 5. Altitude value is parsed from one of the points found in the coordinate string (lat, long, alt).

1260 — 6. Number of floors submitted is stored in the DB.

1270 — 7. Building average floor height is calculated from number of floors and altitude. This is then stored in the DB.

1280 — 8. Floors are inserted into the DB with a floor number (1- #floors) plus the average floor height, and a calculated altitude.

1290 — 9. Camera values for the building are inserted into the DB (Latitude, Longitude, Heading, Tilt).

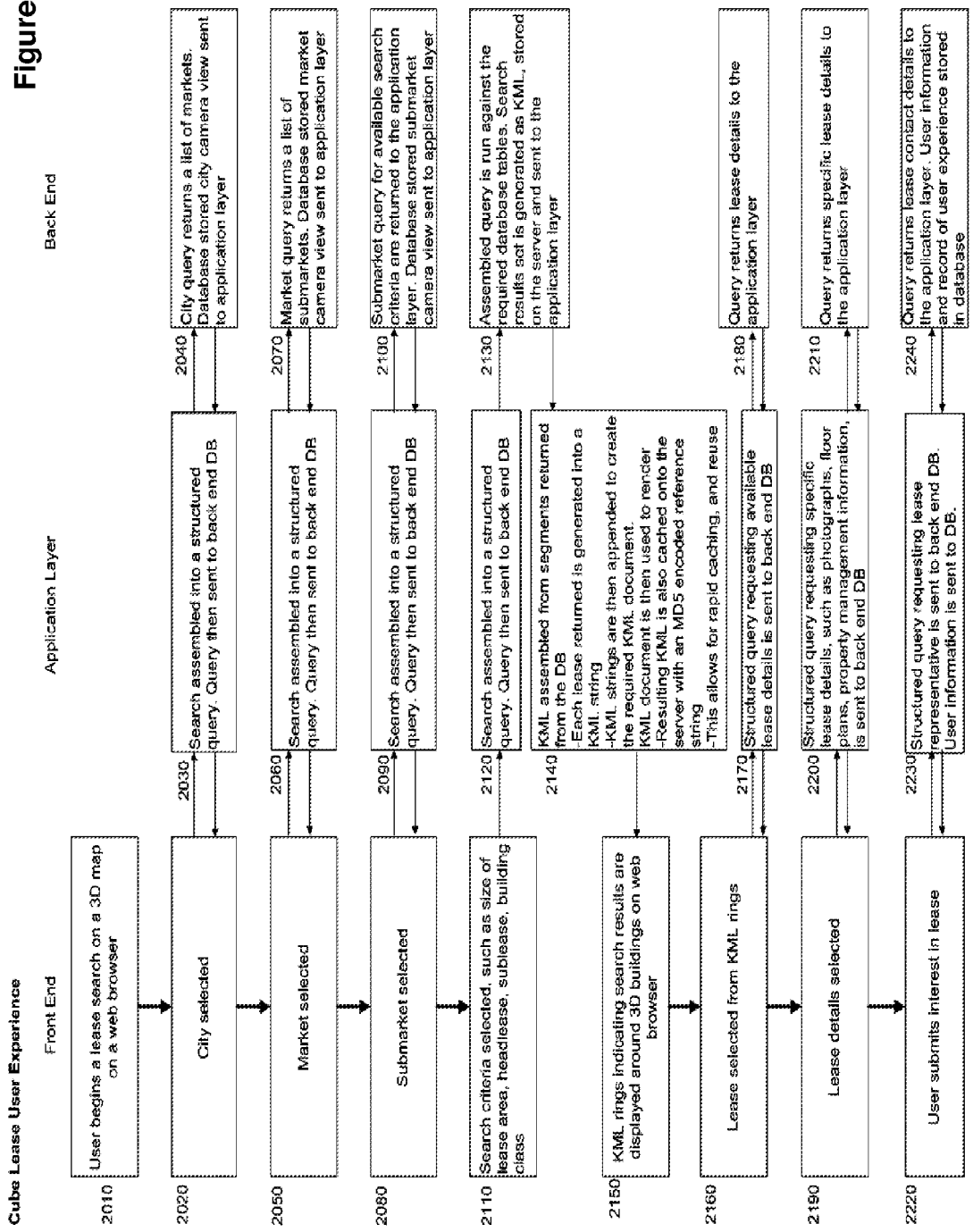

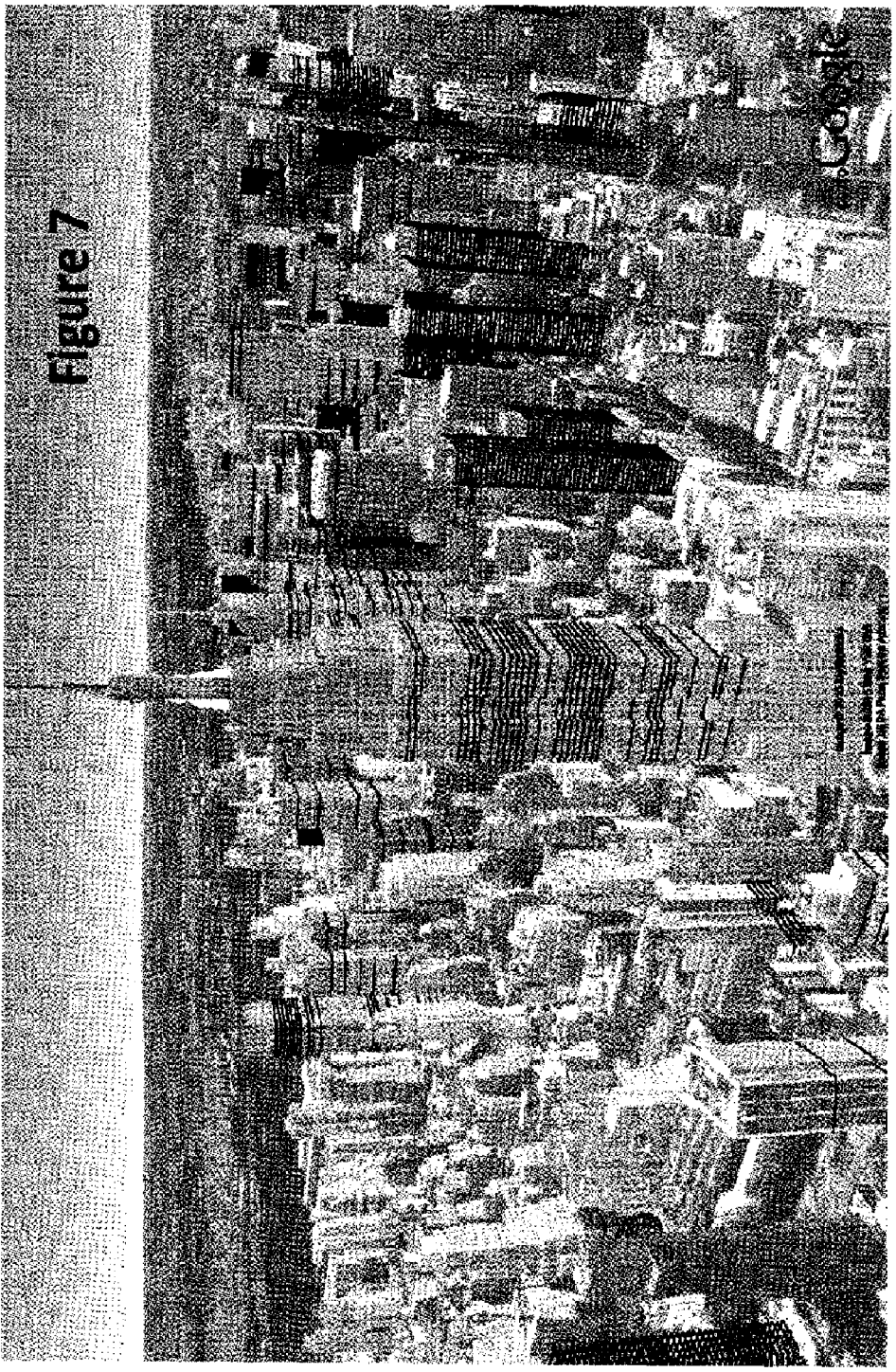

Process diagram for visualization of hotel rooms for a travel website

CREATING AND LINKING 3D SPATIAL OBJECTS WITH DYNAMIC DATA, AND VISUALIZING SAID OBJECTS IN GEOGRAPHIC INFORMATION SYSTEMS

FIELD OF THE INVENTION

The present invention relates generally to geographic information systems, and more particularly, to creating and linking 3D spatial objects with dynamic data and visualizing said objects in geographic information systems.

BACKGROUND OF THE INVENTION

It is conventionally held that 70-80% of business data has a geographic component. With GPS-enabled smart phones, cameras, tablets and navigational devices, the production of geographically unique data is increasing.

Buildings are basic referential objects in society. Community functions, organizations, corporations, social status and many types of information production are frequently related to a building address. In the example of real estate, buildings and units of space within the building are the marketable product and vast amounts of data are generated to describe the characteristics of a property.

Despite the growth in geographically unique data and the referential utility of a building, a generic method does not exist for visualizing multi-media data in three-dimensional space relating specifically to a subject building.

Existing means of combining data and content of various media types (media types that are geographically unique, widely sourced from diverse contributors, time sensitive and frequently updated) generally combine each data element through multiple screens within a browser. This compartmentalization of the data does not integrate it in an informative manner with its location.

For example, the availability of real estate for sale or for lease is generally represented in two-dimensional formats: maps showing location in terms of longitude and latitude, visual media, such as photographs or videos of the building interior and exterior, pictures of floor plans and flat tables listing other information, such as price, terms, special features and broker information. Visualizing this same information in two-dimensional space creates problems when the building population is dense, when multiple properties in the same building are depicted, or when multiple floors are displayed with their respective visual media. Furthermore, information relevant to the real estate acquisition process becomes inaccessible or lost in two-dimensions (e.g., suite views, relative size of the building, and availability of the real estate for sale or lease within the building or the proximity).

A tool known as a Geographical Information System (GIS) has recently become available to the public to show physical locations on a virtual map of the world, and one example of an implementation of this tool is Google® Earth. A map is rendered in two-dimensional form, and geographical objects, such as buildings or infrastructure, may be rendered in a three-dimensional form (within the two dimensions of the viewing screen). A GIS, as a computer-based data-processing application, uses a language for data input, and generally outputs the resulting image to a screen. For example, Google® Earth uses a GeoXML language named Keyhole Markup Language (KML), for expressing geographic annotation and visualization on two-dimensional and three-dimensional maps. Features, such as the shape of the exterior of a building, may be marked on Google® Earth maps by means of KML.

Attempts have been made to show geographical features on a GIS, such as for geographically displaying oil and gas related information. For instance, output files are created based on aggregations of oil and gas data, in particular drilling activity, completion activity, open acreage, well information, well production, land activity, and land boundaries, which output files are able to be overlaid on satellite images in a GIS, and may therefore be visually represented. However, no information is provided regarding the applications in structures above the ground level (e.g., determining the location of and showcasing available space within three-dimensional structures viewable in a GIS in a real estate context).

Hence, there is a need for a means for displaying three-dimensional structural objects in a geographical information system that visually depicts geographically unique information.

SUMMARY OF THE INVENTION

The invention discloses a system and method of creating and linking 3D spatial objects with dynamic data, and visualizing said objects in geographic information systems (GIS). The system comprises a front end for user interface comprising a GIS-enabled web browser, a database at the back end, and an application layer which processes the data sent between the user interface and the database. The database contains a number of tables, including a Building Table, a Suite Table, a KML Ring Table and a Camera Table. The system allows a user, once he or she has specified the type of information he or she is searching for, to see displayed on the GIS-enabled browser a visual representation of the city area with indicators (KML rings) showing the resulting information. A method for the system for inserting the KML rings is disclosed wherein the KML rings are produced for the occupiable portion of the building starting with a base ring that typically encircles the lowest floor of the building, which is then elevated to the correct altitude of the building, corresponding to the highest occupiable floor. A further method for a user to be shown available space by means of a GIS is also disclosed. A user specifies a city, market and submarket to the system, and he or she is presented with a view of the submarket with the available space indicated on the representation of the buildings, by means of code of a markup language such as KML, which is assembled through the queries and results in a ring, for example, around the suite. The user is then able to determine further information about the available space such as the size of the space, when it is available, the type of lease, as well as view photos and floor plans of the space. Finally, the user may contact the property manager or owner and arrange to see the space.

Disclosed is a method for creating, linking and displaying a three-dimensional spatial object, the method comprising generating a multi-geometry string specifying an outline property; retrieving building class data from a database; assigning each building class a different style; retrieving data for each floor of said each building; generating multi-geometry polygons for said each building and associating said each building with said assigned style using the floor data; generating a string of said multi-geometry polygons and styles; generating a spatial object from said string; and displaying it into a graphical information system view. Further disclosed is the above method further comprising using an overlay file to reduce the significance of the background. Also disclosed is the above method wherein the wire structure may be colored based on characteristics of a floor or a building.

Further disclosed is the above method wherein the spatial object is an accurate representation of the exterior of a building or structure, which is comprised of each individual floor that are independent nested spatial object, comprising: geographically and proportionally accurate wire-frame models of the exterior shape of a building or structure; and geographically and proportionally accurate individual floors that are nested within the wire-frame models.

Further disclosed is a method of generating a visual flight between several geographical points, the method comprising: receiving a Globally Unique Identifier that is passed to a database; receiving from the database data associated with said several geographical points including building identification data; determining a start and end point for the flight; creating KML structures associated with the geographical points from the data received using a CPU; retrieving camera views for the start and end point of the flight; and generating and assembling the flight using a CPU and a Geographical Information System Application Programming Interface. Also disclosed is the above method wherein the Globally Unique Identifier is contained within a URL. A further variation is the above method, wherein the geographical points are leases, and the building identification data is leasing data. Also disclosed is the above method wherein the KML structures are rings and balloons adjacent to the rings contain data associated with the KML rings. Further disclosed is the above method further comprising pausing the flight and replaying the flight.

Further disclosed is a method of generating and uploading KML rings comprising indicating a building for the generation of rings; generating a base ring for the building by using GIS to place a series of points joinable to form a ring; elevating the base ring to the altitude of the building to generate a series of rings representing the floors of the building; uploading the series of KML rings into the data system for display in the GIS; and positioning a default camera view of the building.

Further disclosed is a method of showing a cardinal view from a floor of a building in a GIS, comprising: selecting a floor of a building; selecting a direction of view; rendering the correct vantage point using the GIS and the floor of the building and the direction of view; and displaying said rendering to the user through the GIS.

BRIEF DESCRIPTION OF THE DRAWINGS

It will now be convenient to describe the invention with particular reference to one embodiment of the present invention. It will be appreciated that the diagrams relate to one embodiment of the present invention only and are not to be taken as limiting the invention.

FIG. 5A is a flowchart showing stages 1 and 2 of the data input process of creating and linking 3D spatial objects with dynamic data;

FIG. 5B is a flowchart showing stage 3 of the data input process of creating and linking 3D spatial objects with dynamic data;

FIG. 6 is a flowchart showing the data output process of creating and linking 3D spatial objects with dynamic data;

FIG. 7 is an example view of the KML ring around buildings in the GIS;

DETAILED DESCRIPTION OF THE DRAWINGS

Figure 1:
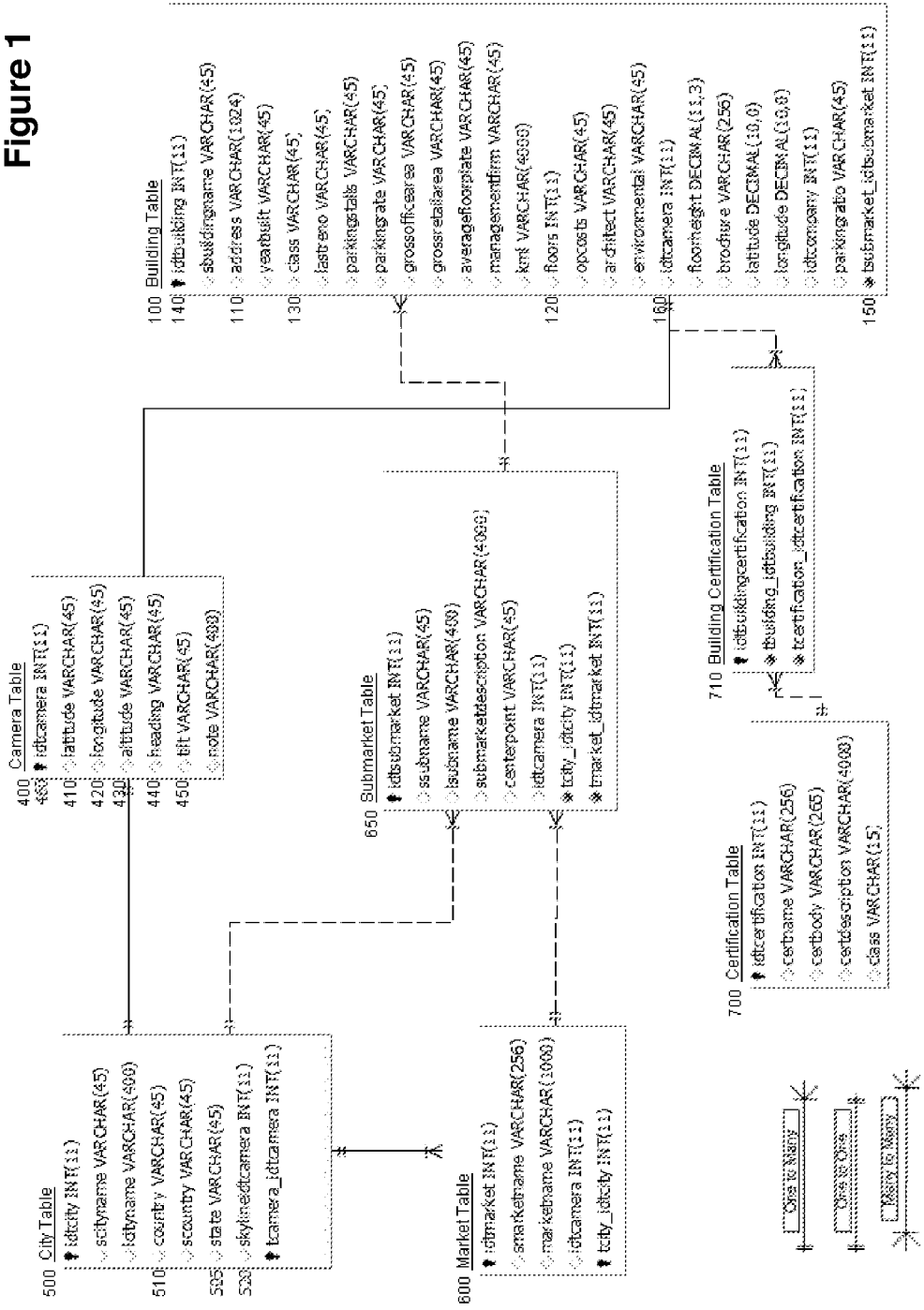
FIG. 1 is a data diagram showing the database structure of the building table.

The present invention will now be described more fully hereinafter with reference to the accompanying drawings, in which preferred and other embodiments of the invention are shown. No embodiment described below limits any claimed invention and any claimed invention may cover processes or apparatuses that are not described below. The claimed inventions are not limited to apparatuses or processes having all the features of any one apparatus or process described below or to features common to multiple or all of the apparatuses described below. It is possible that an apparatus or process described below is not an embodiment of any claimed invention. The applicants, inventors or owners reserve all rights that they may have in any invention claimed in this document, for example, the right to claim such an invention in a continuing application and do not intend to abandon, disclaim or dedicate to the public any such invention by its disclosure in this document.

It is noted that while the following discusses the present invention in connection with creating and linking 3D spatial objects in the real estate market that the principles of the present invention may be applied to any market (e.g., construction) which involves the display of 3D spatial objects with dynamic data to a user on a display. A person of ordinary skill in the art would be capable of applying the principles of the present invention to such implementations. Further, embodiments applying the principles of the present invention to such implementations would fall within the scope of the present invention.

The present invention enables a client to see, using a three-dimensional GIS system, available real estate and leasing space by means of indicators highlighting certain buildings and selected suites within those buildings. One key advantage of using the principles of the present invention is that in using a GIS showing a three-dimensional view, the client is able to see the building or suite in relation to others nearby, the local environment, and within the context of a city or market. Historical data compiled in the database may be used by the system to represent trends in real estate availability and prices over time.

Within the system, data tables co-exist within a relational database, such as MySQL®, which operates on a server. In one embodiment, the database is stored in hard disks and RAM memory while it is being accessed. The server provides the database services to the user interface, which exists partially on a client computer, using a web server, such as the Linux®-based Apache® web server. The client computer may use any number of web browsers, for example Internet Explorer®, or Google® Chrome® to access the GIS plug-in, of which an example is Google® Earth. Data used from the Google® Earth web plug-in includes the 3D building layer, operated by Google® and maintained by Google®'s 3D warehouse. The real estate availability system's interaction with the GIS takes place by means of producing data describing ring placement within a three-dimensional environment being sent through the Internet, by means of routers and transmission lines, from the real estate availability system's servers to the client system of a user, where data from the GIS system is displayed in conjunction with that of the real estate availability system.

With reference to FIGS. 1 to 4, and according to one embodiment of the present invention, the real estate availability system database structure is described. The database consists of several main tables which are interrelated: the Building Table 100, the Suite Table 200, the Floor Table 250, the KML Ring Table 300 and the Camera Table 400. With reference to FIG. 1, the Building Table 100 contains fields of data about individual buildings, at a minimum, the address 110, the number of floors 120, and the class of building 130 which describes the type of business that may operate there. Each table also has a unique key field to identify each record contained therein. For instance, there is also a building ID field 140 to uniquely identify each record. Optionally, other fields may be included to provide a more comprehensive picture of the building for a prospective purchaser or lessee, including the Submarket ID 150, which may be used by real estate vendors. Examples of these fields, without limitation, are the name of the building, the year built, the date of last renovation, the number of parking stalls, the parking rate, the breakdown of the building by office, residential or retail area, the management firm, operating costs, architect name, and building certifications. Each building has associated with it a preferred camera angle 160, for which it is linked to the Camera Table 400, and which is described in detail below. The building is also necessarily situated within a city or a market, and is therefore linked to the City Table 500 and the Market Table 600, described below. A building may optionally have one or more certifications, which may be linked to unique buildings by means of the Certification Table 700, further described below. The Building Table 100 is populated by reference to the building information itself, which is collected by the Agent when preparing the property for listing.

Figure 2:
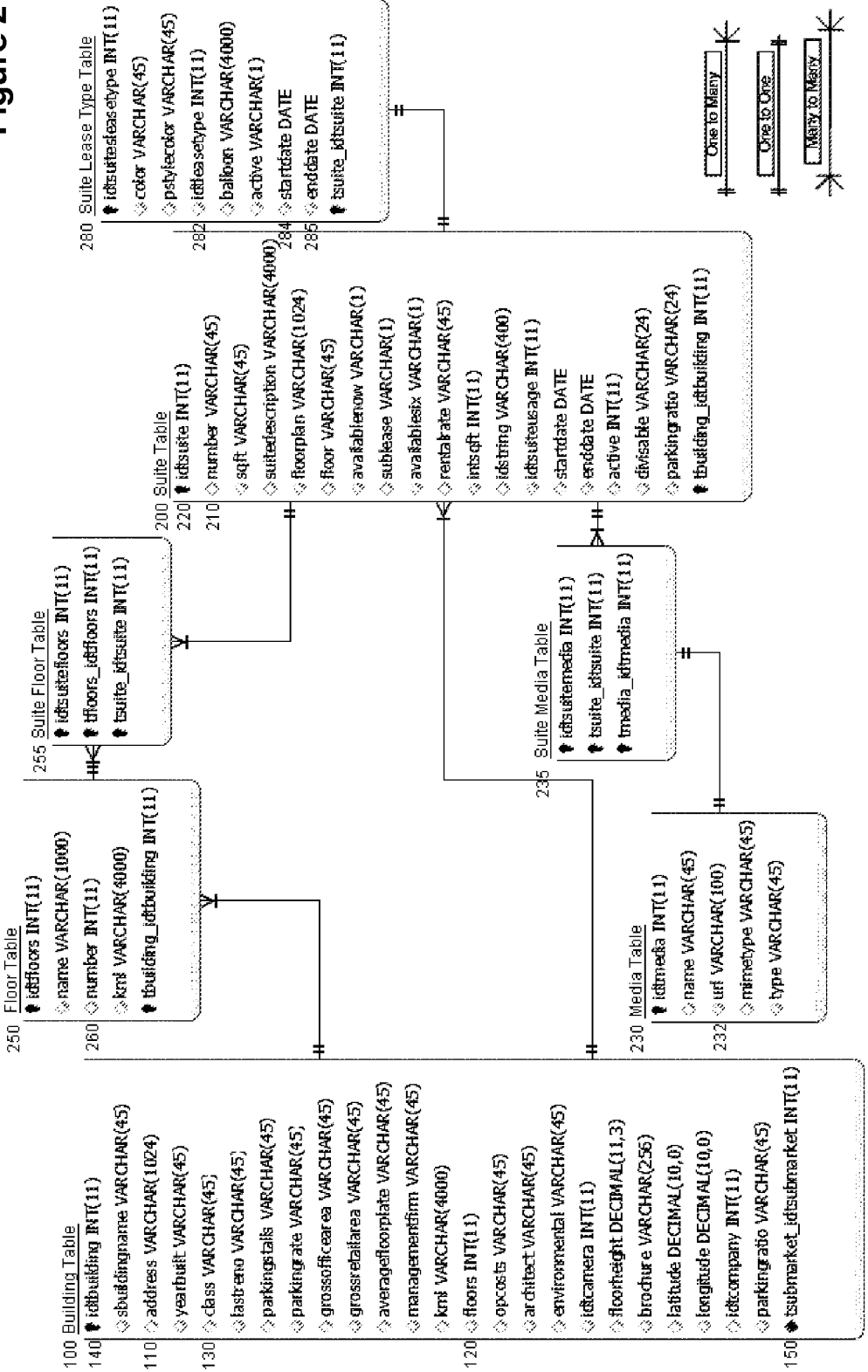
FIG. 2 is a data diagram showing the database structure of the suite table.

With reference to FIG. 2, the Suite Table 200 contains data regarding suite number 210, and other information which is variable and may include the area in square feet, a description, a floor plan, the lease characteristics, the rental rate, the start and end dates. Each suite entry also receives a unique Suite ID 220. The Suite Table 200 may be linked to a Media Table 230 through the Suite Media Table 235, and the Media Table 230 may contain a variety of media that may be linked to the suite, such as video walkthroughs or pictures of the suite, contained in URL addresses in the URL field 232. The Floor Table 250 is linked to the Suite Table 200 by means of the Suite Floors Table 255, and the Floor Table 250 is also linked to the Building Table 100, and contains the floor number 260 on which a suite is located. A suite may have multiple floors, and a floor may have multiple suites. The Suite Table 200 may be associated with a Suite Lease Type Table 280 which contains historical information about the leases for that suite, for example, the lease type 282 and the start and end dates 284, 285. The Suite Table 200 and Floor Table 250 are populated by reference to the building information itself, which is collected by the Agent when preparing the property for listing.

A person skilled in the art would appreciate that the example used in the present disclosure, KML, is one example of a Geography Markup Language, a notation for expressing geographic annotation and visualization within two-dimensional and three-dimensional GIS. Another notable example is GML.

Figure 3:
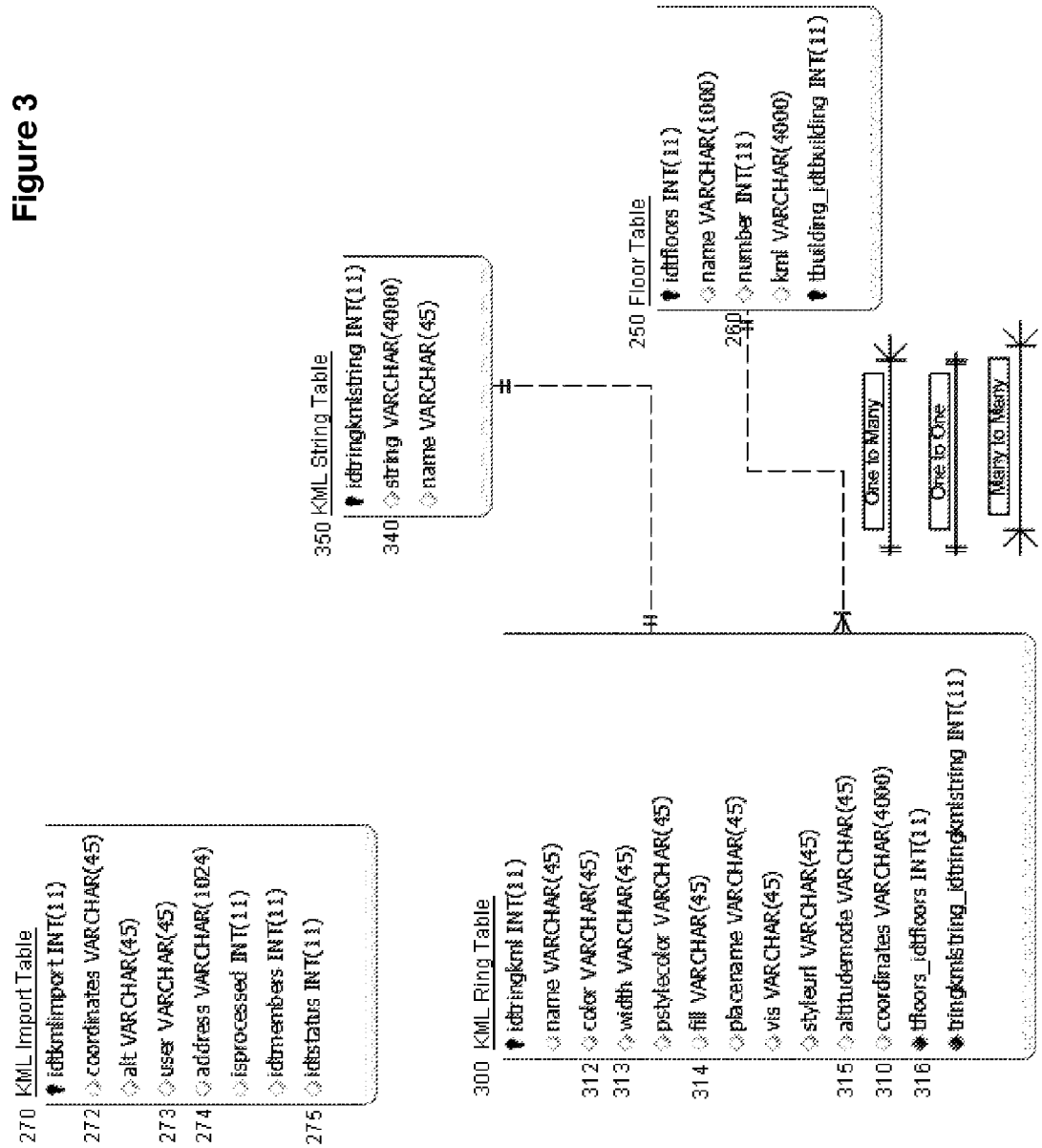
FIG. 3 is a data diagram showing the database structure of the KML table.

With Reference to FIG. 3, the KML Ring Table 300 contains data regarding the KML Ring by means of which an indicator, for example, a colored ring will appear around a building at the location of the floor that is available, and this ring may be colored in different ways, or its opacity varied, to indicate a certain status of the leasing space, such as a head lease or a sublease. The KML color field includes a parameter for setting the opacity. One skilled in the art would appreciate that the indicator may consist of alternative forms to a ring appearing surrounding a certain floor in a building as in the present embodiment. For instance, the indicator may consist of an extruded box, arrows, bars or lines, for example, to identify available space. The KML Ring Table 300 always contains data on the formatting of the ring in KML code in the coordinates field 310, and optionally may contain data on the color 312, width 313, fill 314, altitude 315, and floor 316 among others. Each entry in the KML Ring Table 300 is associated with a floor 316, and has a coordinates field 310 which situates the ring in the three-dimensional space of the GIS through latitude, longitude and altitude of the reference points making up the ring.

The KML String Table 350 contains KML templates in the string field 340, and each template may represent a certain structure around a building, such as a ring around a particular floor, an extruded curtain that covers a lower portion of a building and drops from a certain floor, or a belt that encompasses a number of intermediate floors of a building, for example. The KML Ring Table 300 and KML String Table 350 work together to produce KML representing a ring around a floor. The string field in the KML String Table 350 contains a template which, with the exception of several blanks, contains a complete KML String that may be read by a GIS. The blanks are filled with data pulled from the KML Ring Table 300, such as coordinates of the reference points for drawing the ring, as well as the color 312, width 313 and other information customizing the ring contained in the KML Ring Table 300. Opacity of the ring is controlled within the KML template itself. An entry in the KML Ring Table 300 may be associated with a floor 260 in the Floors Table 250, such that the KML code for drawing a ring may be retrieved for a particular floor. When a new KML ring is drawn, or other KML is added to the database, the KML code is first inserted into KML Import Table 270, which contains information, such as the coordinates of the ring 272, the user name 273 and address 274 of the user, and a status 275 of the imported KML. The KML Ring Table 300 is populated by the method of data input for ring creation described below in the description of FIGS. 5A-5B.

With reference to FIG. 1, the Camera Table 400 contains data regarding the preferred camera view within the GIS, and includes latitude 410, longitude 420 and altitude 430 to position the camera, and heading 440 and tilt 450 to direct and orient the camera's view appropriately. Each entry is uniquely identified by the Camera ID 460. The Camera Table 400 is populated by reference to the location of the building within the GIS, as a default or by a user specifically positioning a camera for an optimal view of the building. Default camera views are created at the same time as a building is entered into the database. Camera views are also available for cities, markets and submarkets, and provide the initial positioning of the camera before the user changes his position within the GIS by means of an input device, such as a mouse, for instance.

With further reference to FIG. 1, the City Table 500 holds information on the city, such as the state 505 and country 510 as well as a preferred camera view 520 for the city. To show a preferred camera view 530, the City Table 500 has a link to the Camera Table 400. Other means to divide a market rather than the city would be the market, which is described with a Market Table 600, or a submarket described with the Submarket Table 650.

Figure 4:
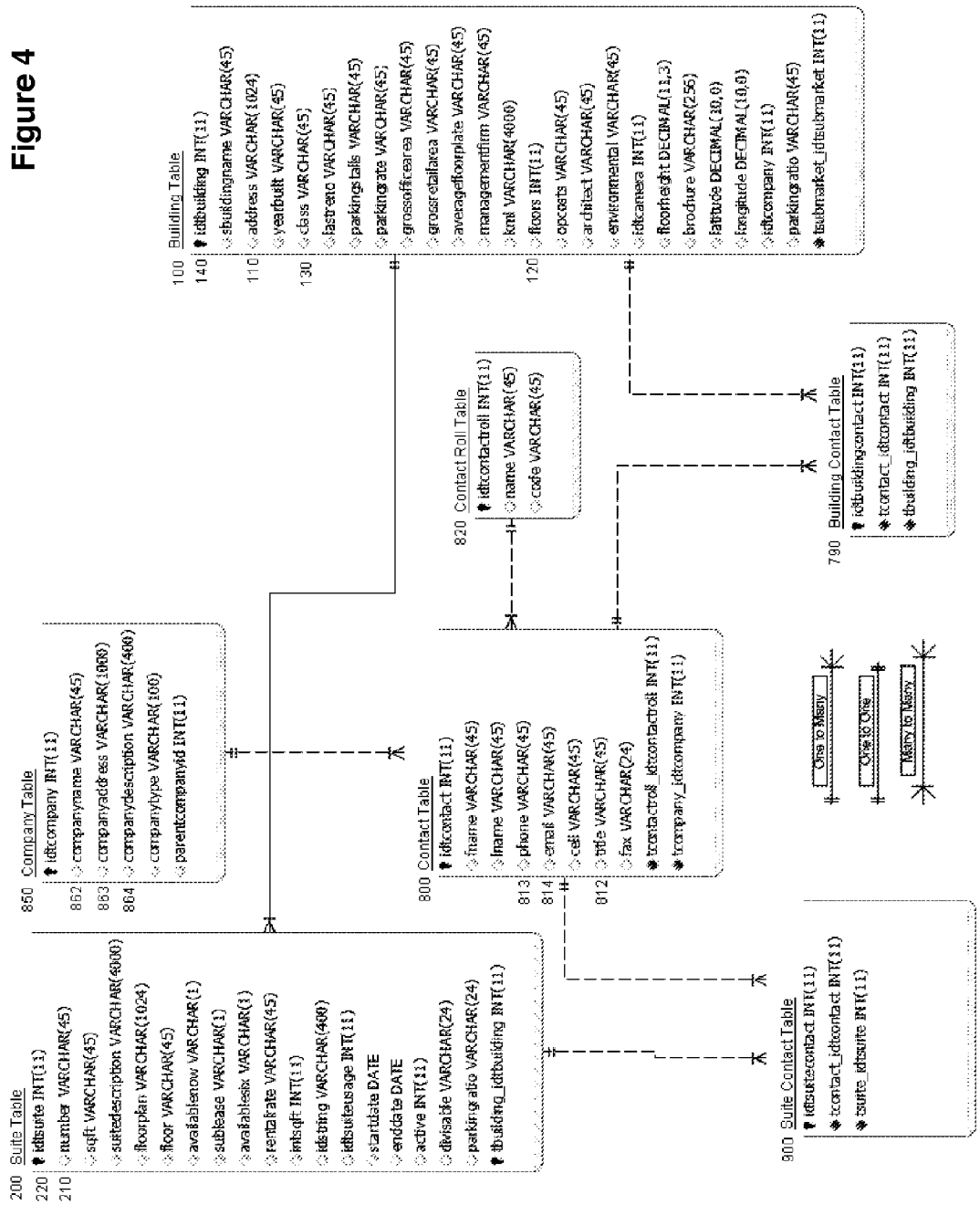
FIG. 4 is a data diagram showing the database structure of the contacts table.

With still further reference to FIG. 1, the Certification Table 700 contains information on the possible certifications a building may have, and certifications are linked to the building through the Building Certification Table 710. A building may have several certifications in environmental achievement, such as energy efficiency or using recycled materials, to safety certifications regarding earthquakes, for example. With reference to FIG. 4, buildings may also be associated with contacts in the Building Contact Table 790, which links a building with one or more property managers or owners. The Contact Table 800 contains the title 812, phone number 813, email 814 in addition to other information of the contact, and one contact may be associated with many buildings, in the same way that many contacts may be associated with one building. A contact may have a contact roll, which is contained in the Contact Roll Table 820. Examples of a contact roll include a Real Estate Broker, a Real Estate Agent, a Property Manager and a Property Leasing Representative. Each contact may be associated with a company through the Company Table 850 which contains information about each company, such as the name 862, address 863 and description 864. A suite may also have one or more contacts, which are linked to the Contact Table 800 by means of the Suite Contact Table 900.

Using the four main tables described above, the Building Table 100, the Suite Table 200, the KML Ring Table 300 and the Camera Table 400, and referring now to FIGS. 5A and 5B, the method of data input for ring creation is described below in accordance with an embodiment of the present invention. The method is divided into three stages for ease of comprehension: the first stage is the KML Ring Generation; the second stage is the KML Ring Upload; and the third stage is the System Processing. Referring now to FIG. 5A, and in particular the first stage KML Ring Generation, steps 1010 to 1050 are described. Once performed, steps 1010 to 1050 result in the creation of KML locations, determined by latitude, longitude and altitude, that correspond to a building's highest point representing the external footprint for the building. In step 1010, the analyst loads a KML file which indicates, using place marks, the building that is selected for ring generation. In step 1020, the analyst then identifies the address of the building indicated by the place mark. In step 1030, the analyst uses the GIS to generate a base ring for the building in question. This process uses a series of points (latitude, longitude and altitude) to represent a point on the ring, and when all the points are connected a ring is produced.

This base ring typically encircles the lowest floor of the building. In step 1040, the base ring is then elevated to the correct altitude of the building, corresponding to the highest occupiable floor. In step 1050, the KML representing the points representing this ring is then saved with the address of the building identified in step 1020. In order to accommodate buildings that change shape as the altitude increases, such as the tapering Empire State Building in New York City, coordinate data for the KML rings is refined and maintained by repeating the KML ring-generating method across the building or structure shape and setbacks, applying the difference to the coordinate data collected during the initial pass of the building or structure.

Referring now to the second stage, KML Ring Upload, steps 1110 to 1170 are described. The result of the second stage is that the KML files that have been generated by the analyst in the first stage are uploaded and imported into the data system. In Step 1110, the analyst navigates to the data administration area, which holds tools for data import and validation. In Step 1120, the analyst loads the KML into the data system, by selecting the correct submarket for the building in step 1130, and specifying the file to upload in step 1140. In step 1150, the number of occupiable floors is uploaded into the data system. In step 1160, the analyst uses the GIS application to position a camera view of the building to set coordinates that will be used as the default view of the building being uploaded. In step 1170, the analyst submits the building and values described above for back end processing, and the data is stored in the KML Import Table 270.

Referring now to FIG. 5B and the third stage System Processing, steps 1210 to 1290 are described. The result of the third stage is that the information submitted by the analyst in the second stage is parsed and stored within the data tables. In step 1210, the uploaded KML file is stored in a temporary folder location within a server. In step 1220, the parsing process for the KML file is initiated, and, in step 1230, the building address is stripped from the KML file and inserted into the Address field 110. In step 1240, the coordinate strings (latitude, longitude and altitude) for all points representing the ring are parsed from the KML file. In step 1250, altitude is parsed from one point's coordinate string. In step 1260, the number of floors submitted in step 1150 is entered into the Floors Table 250 and specifically a floor number 260. In step 1270, the building average floor height is calculated from the number of floors and altitude, which is then stored in the KML Ring Table 300 as the width 313. In step 1280, the floors are inserted into the Floors Table 250 with a floor number 260, the average floor height and a calculated altitude of the floor. In step 1290, a preferred camera view for the building is inserted into the Camera Table 400, including specific field data on the latitude 410, longitude 420, altitude 430, heading 440 and tilt 450.

Figure 8:
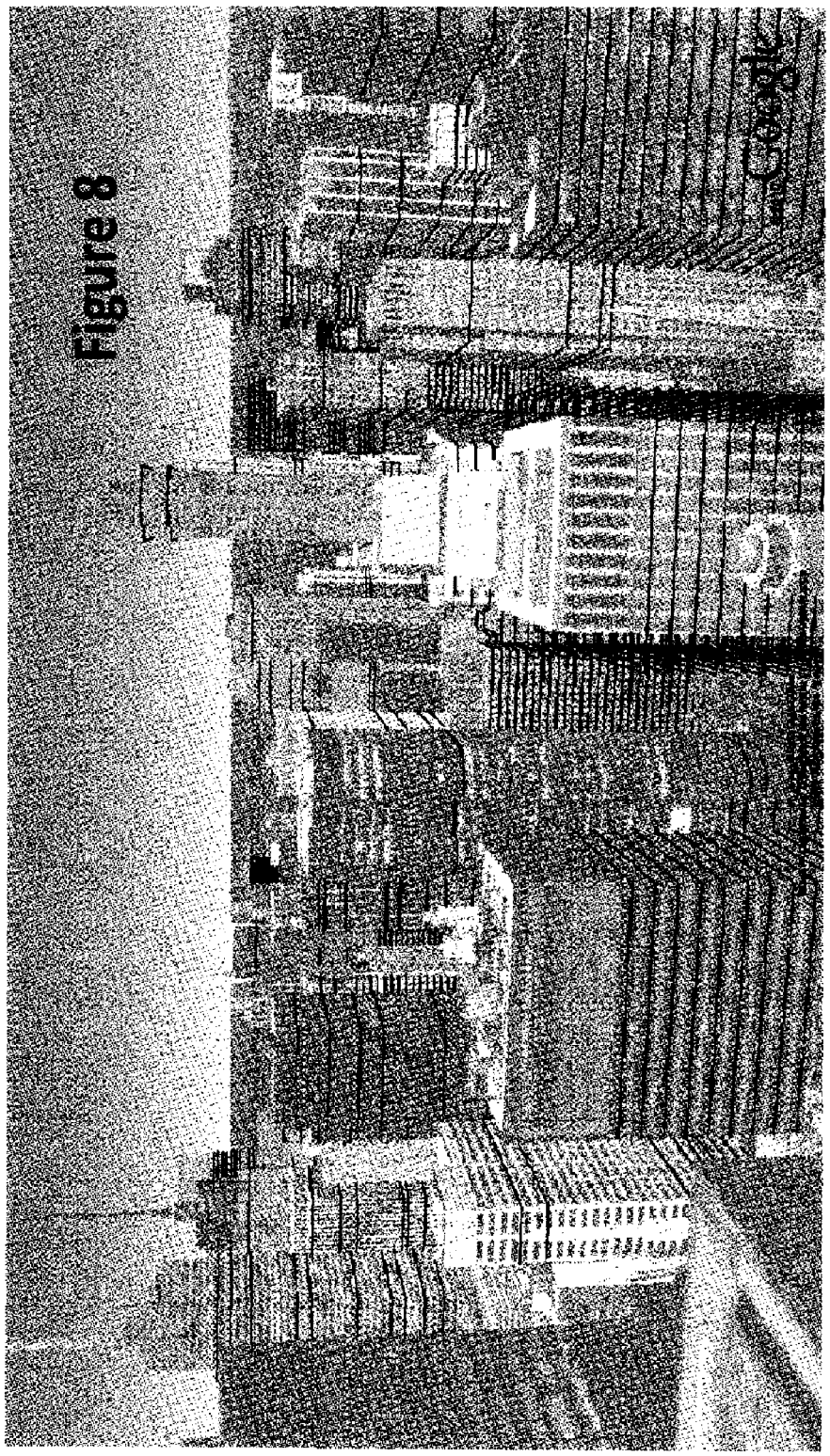
FIG. 8 is an additional example view of the KML rings around buildings in the GIS.

With reference to FIG. 6, the method of providing the real estate availability information to the end user by rendering the appropriate rings is described. The end user prepares a query using a form containing fields, and once submitted, receives a GIS view of the market or building that he or she is interested in, along with indicators, such as the rings described above showing available space and the qualities of that space, examples of which are shown in FIGS. 7 and 8. The steps in the method are described, wherein generally data from the user input at the front end is passed through the application layer, which assembles queries for the database which is the back end. The database then produces results which are then passed back through the application layer to the user's interface. In step 2010, a user opens a web browser to search for available space. The GIS presents the user with a view above North America, and the user selects a city in step 2020. The chosen city is then assembled into a structured query in step 2030, and the database receives the query and returns a list of markets and a stored camera view of the city to the user's computer in step 2040. The user is then presented with a view of that city and he or she selects a market in step 2050. The chosen market is then assembled into a structured query in step 2060, and the database receives the query and returns a list of submarkets and a stored camera view of the market to the user's computer in step 2070. The user is then presented with a view of that market and he or she selects a submarket in step 2080. The chosen submarket is then assembled into a structured query in step 2090, and the database receives the query and returns a list of available search criteria for that submarket and a stored camera view of the submarket to the user's computer in step 2100.

In step 2110, the user selects search criteria such as the size of the lease area, head lease, sublease, and building class for instance. In step 2120, the search is assembled into a structured query, which is sent to the database. In step 2130, the query is run against the database and the search results are generated as KML, stored on the server and sent to the application layer. In step 2140, KML is assembled from the segments returned from the database. Each lease returned is generated into a KML string, which are then appended to a template to create a KML document that renders the ring. The KML is also cached on the server for ease of reuse. In step 2150, KML rings indicating search results are displayed on the GIS on the user's browser, and examples of this are shown in FIGS. 7 and 8. In step 2160, a lease is selected from the KML rings displayed, and this is sent to the database as a structured query in step 2170, which results in the lease details being returned to the user's computer in step 2180. More specific lease details may be requested by the user in step 2190, and, in step 2200, the structured query is sent to the database, which in step 221,0 returns more specific details, such as photographs, floor plans and property management information.

If the user is interested in contacting a person regarding the lease, then in step 2220, the user submits a request indicating their interest, which is a structured query sent to the database through the application layer in step 2230, and, in step 2240, the database returns the contact information to the user.

Figure 9:
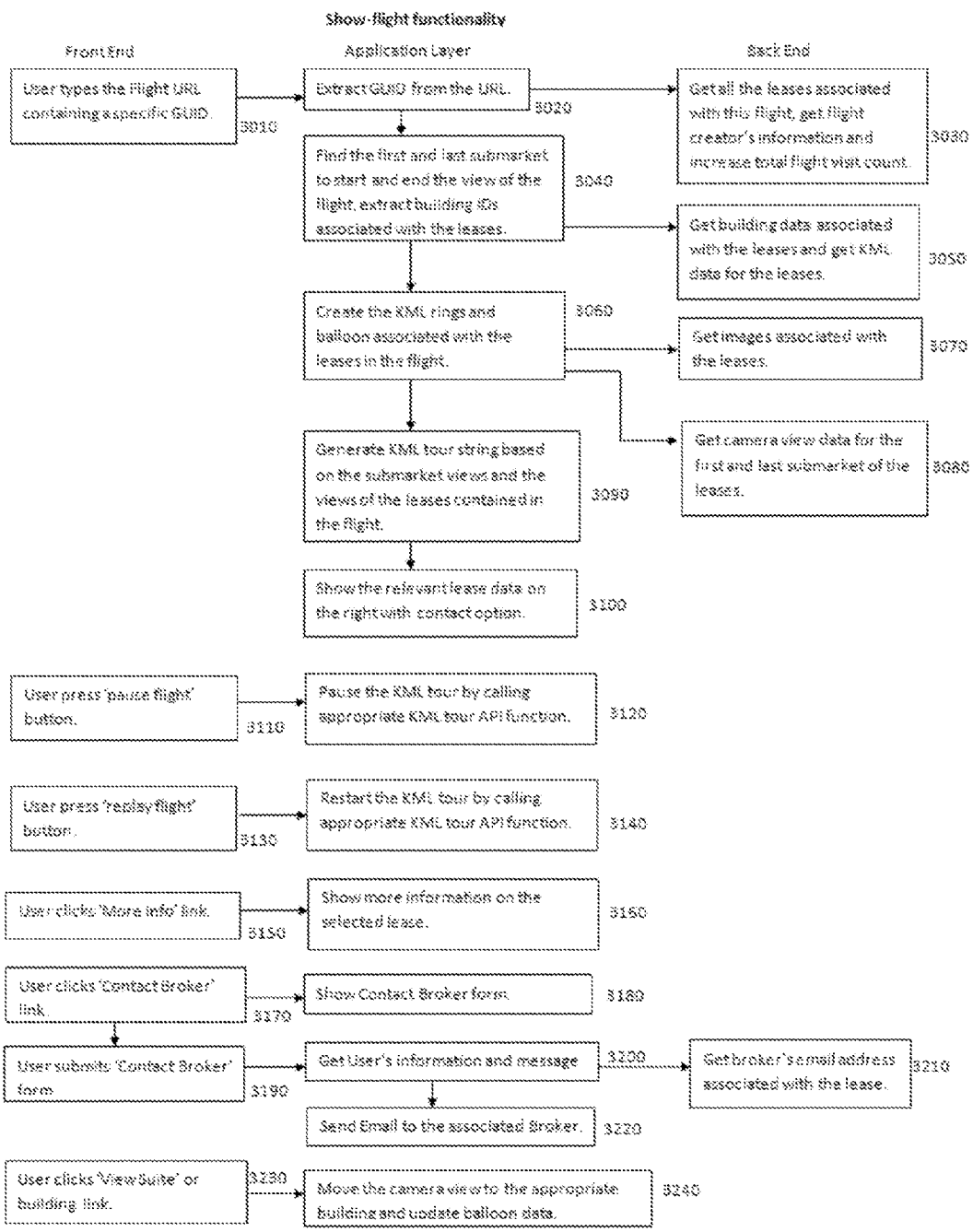
FIG. 9 is a flowchart showing the data movements and computations in the show-flight functionality in accordance with an embodiment of the present invention.

With reference to FIG. 9, the data movements and computations of the show-flight functionality is shown in accordance with an embodiment of the present invention. The flight represents a visual journey through the GIS between several geographical points, with the representations of the geographical features encountered in the flight to be displayed for the user. It is a set of saved search and location parameters that can be re-run and re-created as many times as is desirable, being modified accordingly as new data is added to the system. The flight may pause on each building of interest in order to give the user a chance to interact with data relevant to a specific building or floor, which data may be shown in a side panel of the screen. Three columns are shown, the first representing the front end, that is the user interface, typically running on a client computer, such as the user's laptop computer; the second column represents the application layer which operates on a web server or an application server behind the web server, where an application running on either the client or server processes and transfers data between the front layer and back end; and the third column representing the back end is the data server and database layer, which may also exist on the web server but more frequently is found as a separate data server, where data is retrieved and manipulated and some data-intensive computation is performed. The data is transmitted by means of a network, such as the Internet, each computer using a network interface card to synchronize and verify communications with the other computers.

In step 3010, the user types the flight universal resource locator (URL) containing a specific Globally Unique Identifier (GUID) into the client software which may exist on a client machine, such as the user's laptop computer, which is passed to the application layer on the application server, which layer extracts the GUID from the URL in step 3020. The GUID is passed to the back end data server and database which retrieves all the geographic locations (in a real estate embodiment, these locations are leases) associated with the flight at step 3030, and optionally retrieves the flight creator's information and increases the total flight visit count. The GUID is also passed from step 3020 to step 3040 also at the application layer where the first and last location, for example, submarket, to start and end the view of the flight, as well as the building identification associated with the geographical locations (in one embodiment leases) are found and extracted. This data is passed to the back end to retrieve the building data associated with the leases and retrieve associated KML data for the leases at step 3050; the data from step 3040 and 3050 are also used in the application layer at step 3060 to create KML rings and balloons associated with the leases in the flight. Balloons appear adjacent to certain rings or a building representing various features or data of the rings or building. Also, using the data, the system then retrieves the images associated with the leases at step 3070, and retrieves the camera view data for the first and last submarket of the leases at step 3080. The data from steps 3060, 3070 and 3080 is passed to step 3090, where the KML tour is generated based on the submarket views and the views of the leases contained in the flight. In step 3100, the tour is assembled and prepared for viewing using the GIS application, and the relevant lease data is shown on the right of the screen while the user proceeds through the tour. The lease data on the right may contain an option to contact the property manager, for example.

There are various features which facilitate use of the show-flight tour. If the user uses the "PAUSE FLIGHT" function at step 3110, the application layer pauses the KML tour by calling the appropriate GIS application function at step 3120, which handles the pausing feature for the user, wherein all settings are saved and the user can resume at the same point in the tour. In step 3130, the user may use the "REPLAY FLIGHT" feature, which in step 3140, is invoked by calling the appropriate GIS application function, which restarts the tour for the user. In step 3150, the user can click the "MORE INFO" link, which in step 3160 shows further information on a selected lease, the further information already having been retrieved in steps 3030 and 3050. In step 3170, the user may choose to "CONTACT BROKER", which in 3180 displays a contact Broker form which may be filled out by the user and submitted in step 3190. At step 3200, the user's information and message for contacting the broker is formatted. In step 3210, the email address of the broker is retrieved from the back end before being sent to the application layer at step 3220 where an email is assembled containing the user's information and is subsequently sent to the broker. If the user employs the "VIEW SUITE" functionality or clicks the building link in the front end user interface at step 3230, the application layer moves the camera view to the appropriate building and updates the balloon data at step 3240. In this case the balloon adjacent to the building contains data from the Media Table 230 and the Suite Table 200 and is displaying various characteristics to the user, such as square footage, however any data may be displayed to the user.

Figure 10:
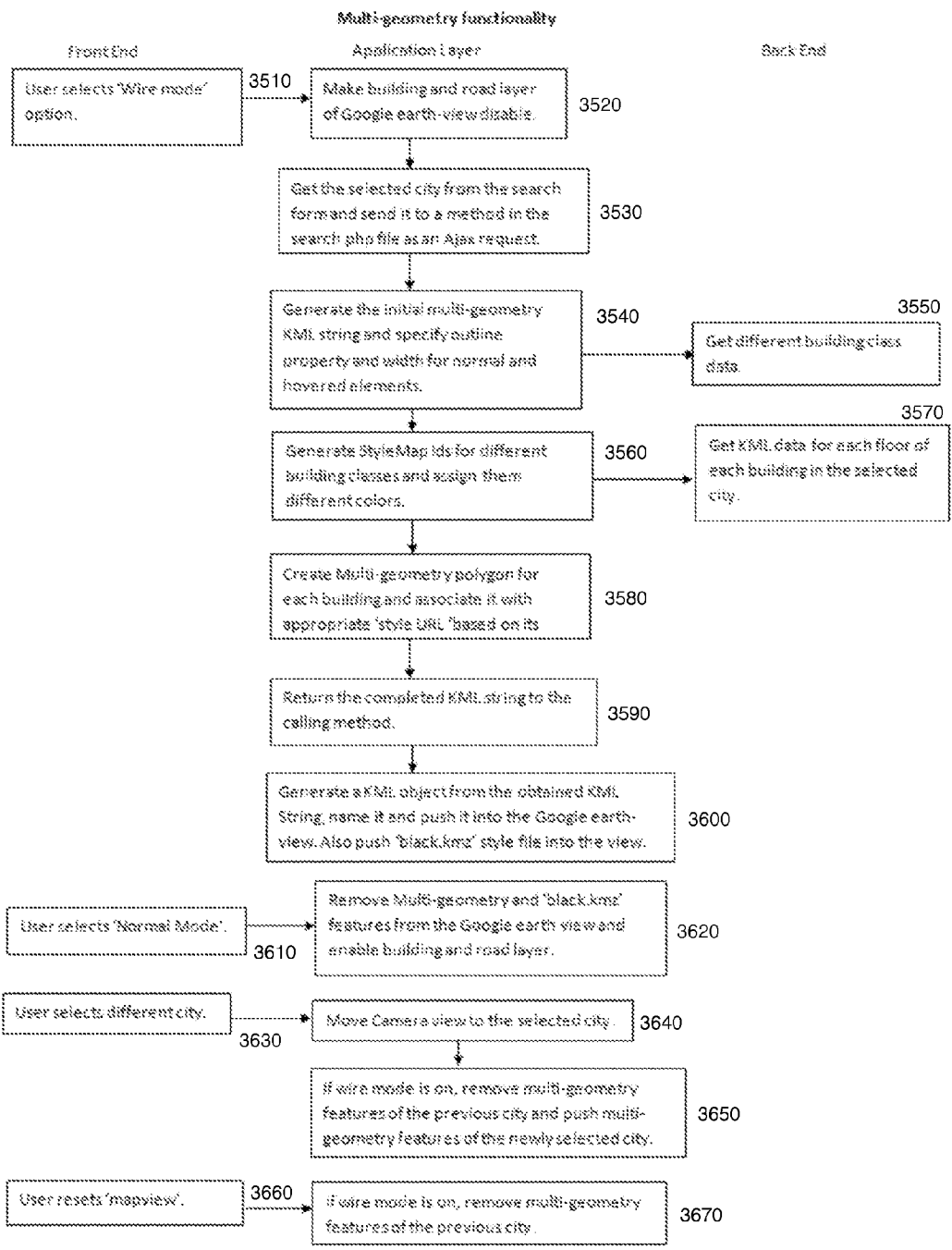
FIG. 10 is a flowchart showing the data movements and computations involved in the multi-geometry functionality in accordance with an embodiment of the present invention.
Figure 10B:
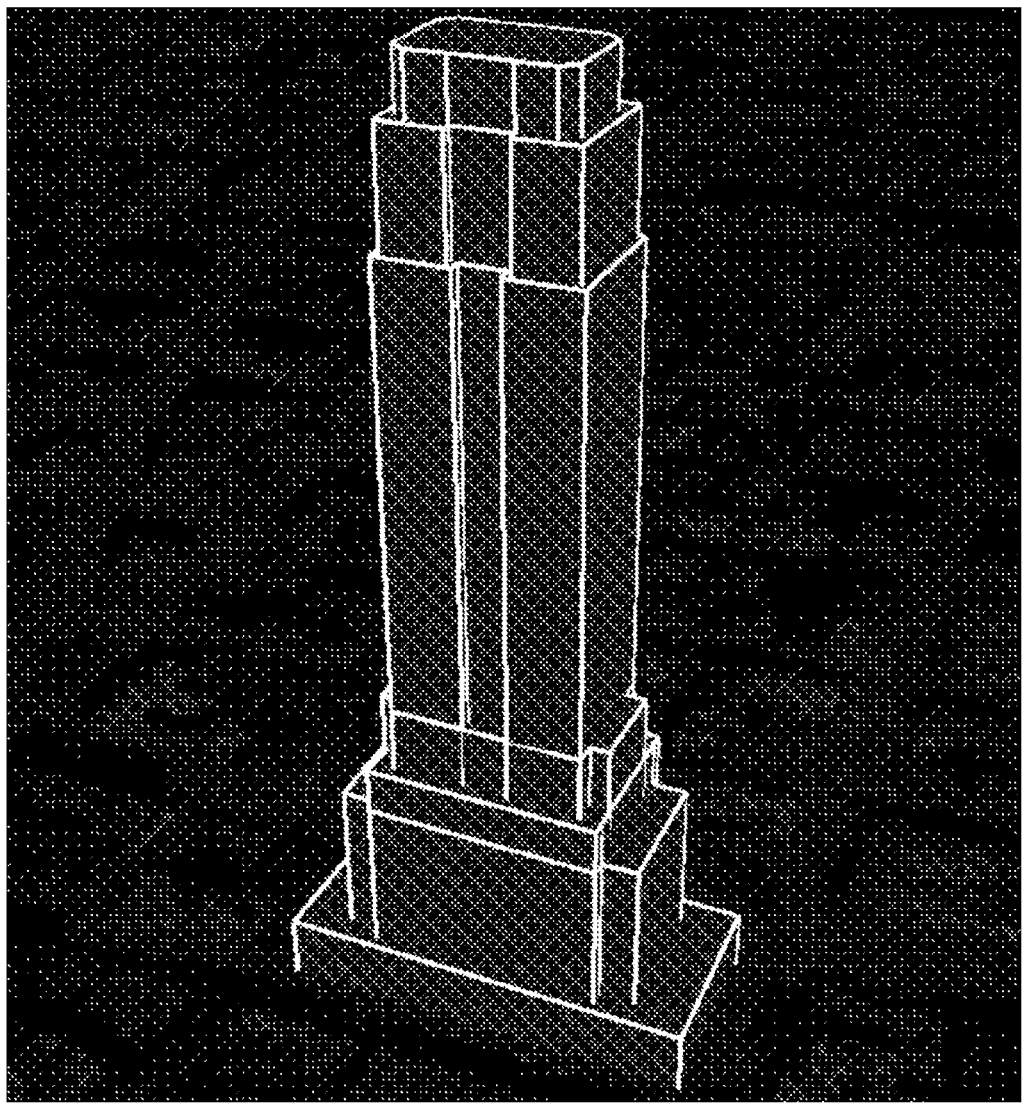
FIG. 10b is an example of a wireframe model of a building displayed within the GIS.

With respect to FIG. 10, the data movements and sub-processes of the multi-geometry functionality is shown in accordance with an embodiment of the present invention. This functionality permits a building to be seen as a wire structure, an example given in FIG. 10b, with information on characteristics regarding the structure shown in the wire outline, for example, leasable space, rents and availability, so as to be visible in a different color, for example, to stand out from the other buildings. Each floor may also have its own color in order to represent characteristics of the floor in contrast to other floors. The "wire mode" replaces the building and road layers of a GIS such as Google® Earth. The functionality results in a system to visually display the spatial objects in three ways: a) stand as accurate representations of the physical building or structure; b) overlay 3D renderings of buildings to visualize information about the building in its entirety or more granularly at the level of a single floor; and c) invisibly sit underneath a building rendering to store interior information, or enable linked multi-media data to be revealed with a mouse hover or click.

In step 3510, at the front end, the user selects the "WIRE MODE" option. In step 3520, at the application layer, the building and road layers of Google® Earth's views are disabled, as the wire mode objects to be created will replace these layers. Also, in the application layer, at step 3530, the selected city is retrieved from the search form and sent as a standardized search file, an Asynchronous Javascript and XML (Ajax) request, to the method at step 3540. At step 3540, the initial multi-geometry KML string is generated and the outline property and width for normal and hovered elements is specified. At step 3550 building class data is retrieved from the date base, which data is passed to step 3560. In step 3560, Style Map IDs for different building classes are generated and each building class is assigned a style, a unique visual representation, such as a unique color. In step 3570, the KML data for each floor of each building is retrieved. Using the KML floor data from step 3570, in step 3580, multi-geometry polygons are created for each building. As the style of multi-geometry buildings can be a function of any building-related variable in the database (the example in FIGS. 11A to 11C describe a multi-geometry style based on classifying hotels by asking rate, therefore, the color of the hotel is different depending on the nightly room rate), therefore each building is also associated with its appropriate style based on its class. In step 3590. the completed KML string is returned to the calling method, and, in step 3600, the KML spatial object is generated from the obtained KML string. It is then named and pushed back into a GIS view such as the Google® Earth-view. Also, an overlay file may be pushed into the Earth-view. The overlay file is able to modify the background, often a satellite image, that is shown such that a "busy" background may be treated with an opaque overlay which greys or blacks out the background (satellite images) to reduce the significance of the background and allow the user to focus more on the structures.

In step 3610, the user selects "NORMAL MODE", which results in the application layer in step 3620 removing the multi-geometry and style file features from the Google® Earth-view and enabling the building and road layer, so that the user may view the standard Google® Earth-view. In step 3630, the user selects a different city, and the application layer processing the request moves the camera view to the selected city at step 3640, and at if wire mode is on, at step 3650, the multi-geometry features of the previous city are removed and the multi-geometry features of the newly selected city are pushed. In step 3660, if the user resets the map view, then, at step 3670, if the wire mode is on, the multi-geometry features of the previous city are removed.

Figure 11A:
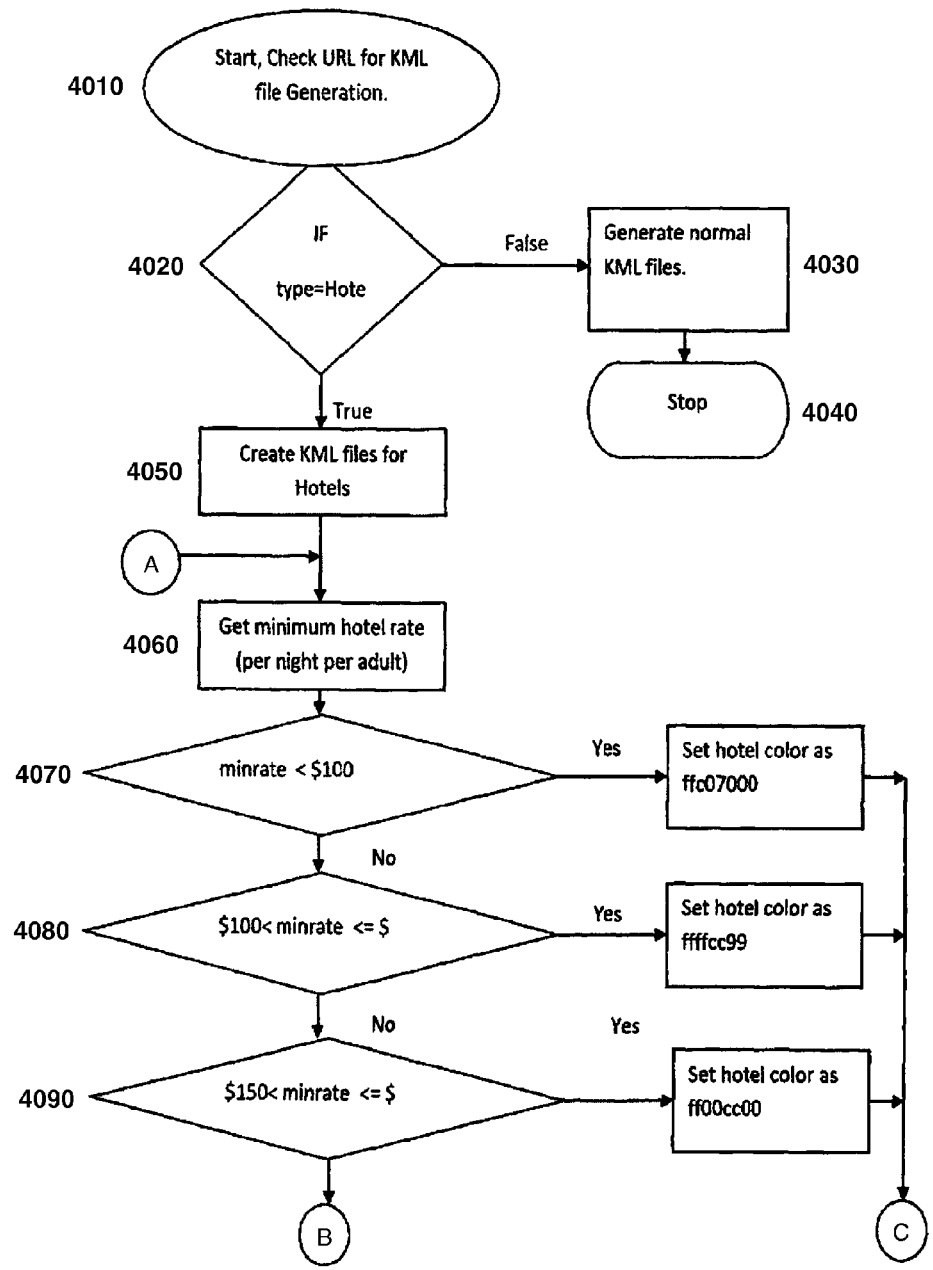
FIGS. 11A, 11B and 11C show a process diagram for the travel agency hotel visualization functionality in accordance with an embodiment of the present invention.
Figure 11B:
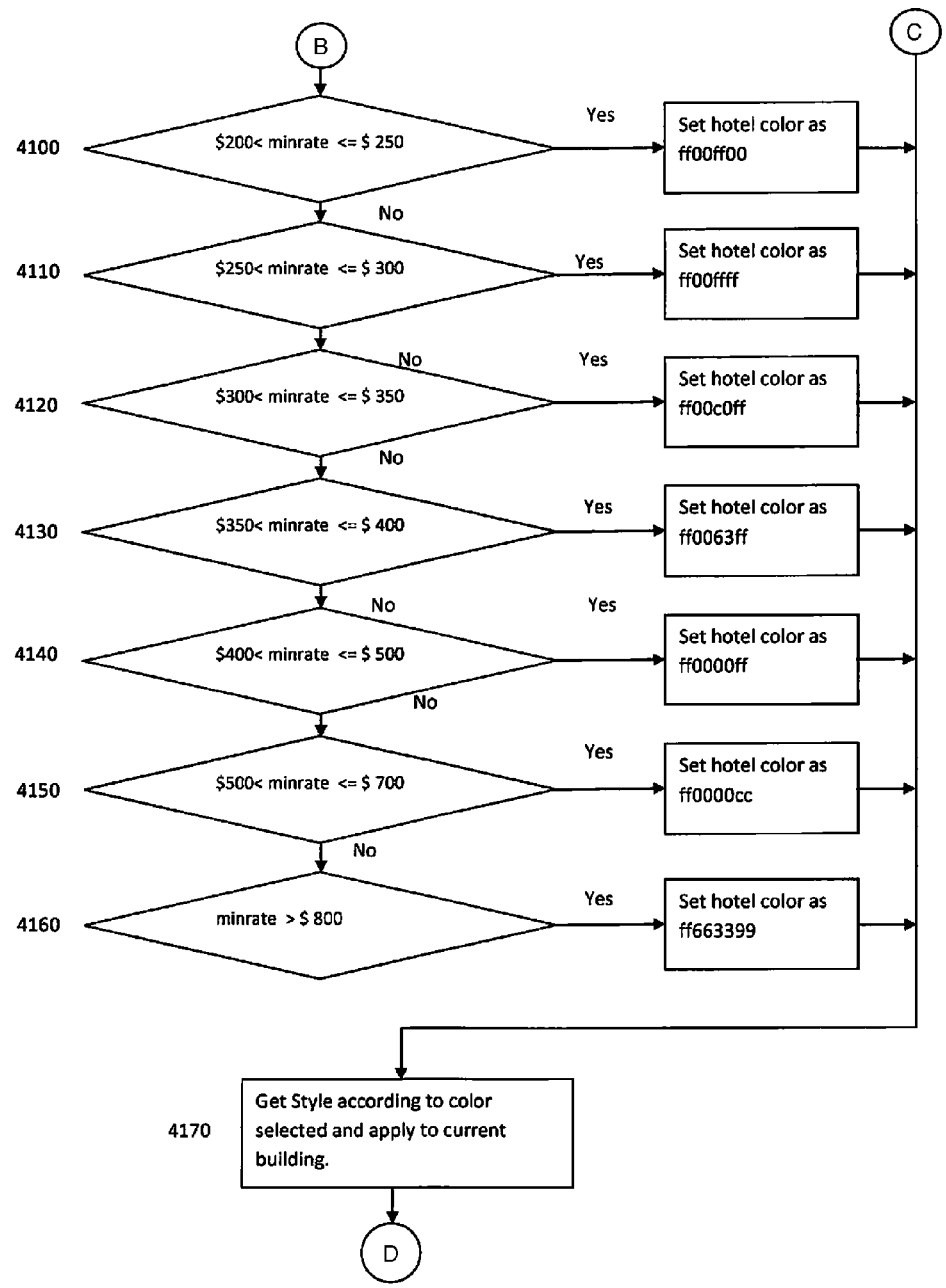
Figure 11C:
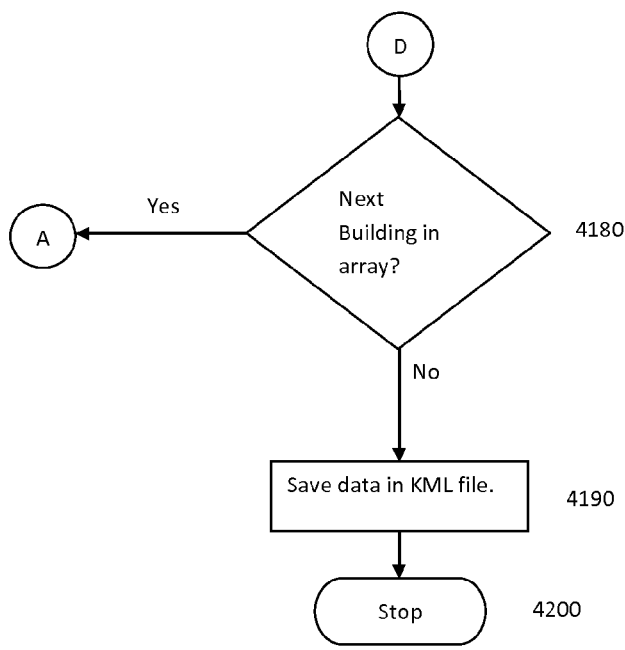

FIGS. 11A through 11C show the process diagram for visualization of hotel rooms for a travel agency, as an example, of the capabilities of the system in accordance with an embodiment of the present invention. In step 4010, the process initiates the KML file generation. At step 4020, the process determines if the type is a hotel. If not, then at step 4030, the process generates normal KML files and exits the procedure at step 4040. If the type is a hotel, at step 4050, the KML files for the hotels are created. With reference to FIGS. 11A and 11B, in the next series of decisions in steps 4060 through 4160, the procedure determines a categorization for a hotel based on the minimum hotel rate per night, and assigns a unique color to each category of hotel rate, the color which every hotel within that rate will appear. This facilitates a user viewing the hotels in Google® Earth, for example, to immediately receive an indication of the minimum rate category and geographical position of the hotel. Of course, the colors assigned to the hotels may indicate other variables that the viewer is interested in, such as the grades of rooms, or whether the hotels have certain features.

At step 4170, the style incorporating the color choice is applied to the current building. In step 4180, shown on FIG. 11c, the procedure moves to the next building in the array and repeats the same procedure (starting at A) involving steps 4060 through 4170. Step 4180 continues repeating, and consequently steps 4060 to 4170, for each building in the array. When all the buildings have been categorized and colored appropriately, the data is saved in a KML file in step 4190 and the procedure is terminated at step 4200.

Figure 12:
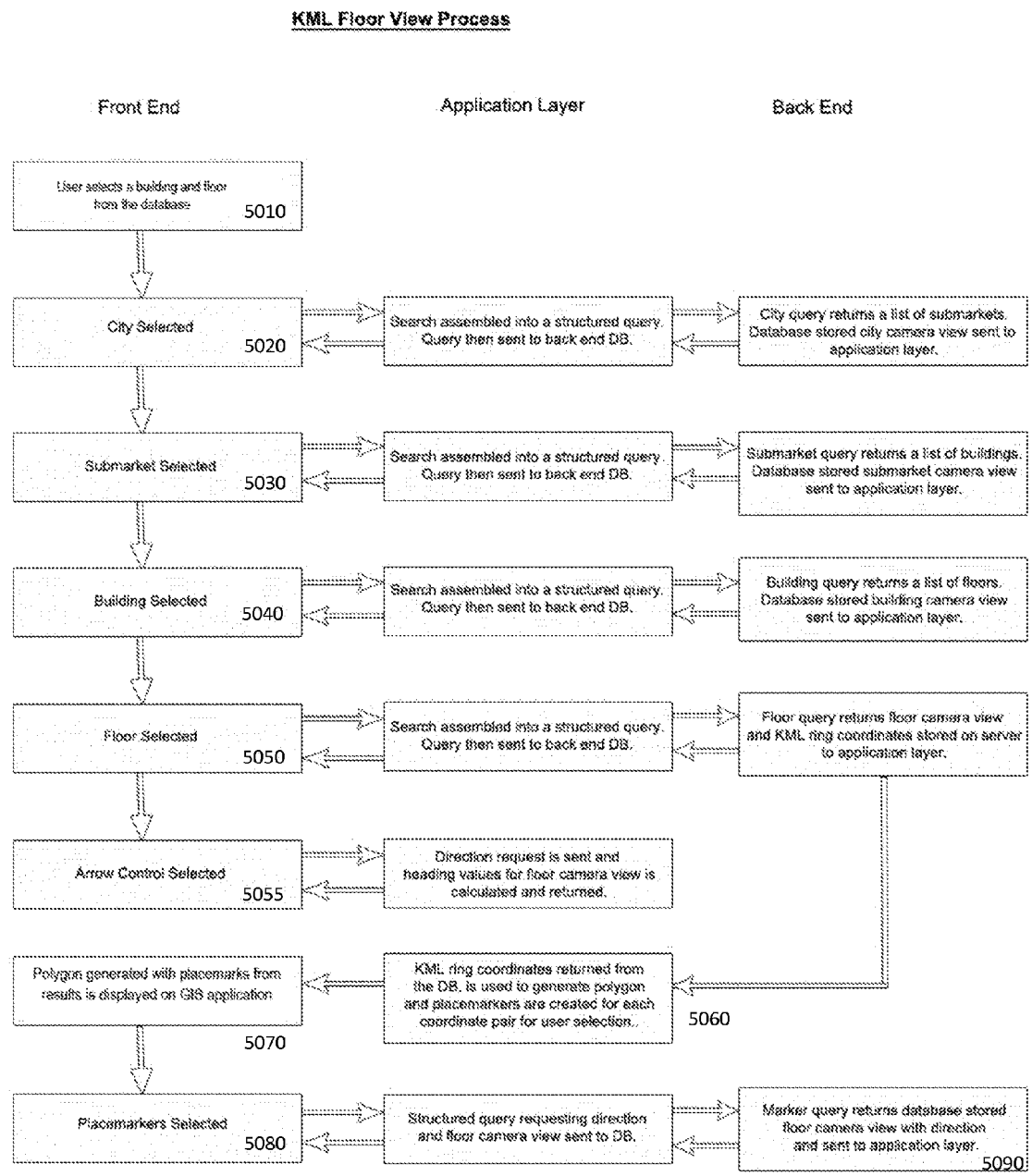
FIG. 12 shows a process diagram for the KML floor view functionality in accordance with an embodiment of the present invention.

With reference to FIG. 12, the KML Floor View process is shown, which permits a user to be shown a 360 degree view from any floor in a given building, what a viewer would see if on that floor in the building looking out, in accordance with an embodiment of the present invention. This view is displayed on the GIS application using data stored in the database.

This is illustrated in FIG. 12, in step 5010, by the user using a client computer and user interface selects a building and floor from a database existing on a data server within the application. This action by the user is encompassed in steps 5040 and 5050 as well. Optionally, the user may choose a city and a submarket using the user interface on his or her client computer in steps 5020 and 5030 respectively. When the city is chosen in step 5020, the database returns a list of submarkets within that city. When the submarket is chosen in step 5030 from the list, the database returns a list of buildings. When a building is chosen in step 5040, a list of floors is returned from the database. When the floor is selected in step 5050, the data specific to that floor is returned by the database to the application, for example, the floor camera view and KML ring coordinates. In step 5055, a direction is chosen, which for simplicity may be a cardinal direction such as north, west, east or south, or may be any horizontal direction relative to the building, and the direction is sent to the database and heading values for the floor camera view is calculated and returned. The directional view stored in by the coordinates in the database is used to render the correct vantage point, a view from the chosen floor of the chosen building in the cardinal direction chosen by the user The data is transferred to step 5060 where the KML ring coordinates are used to generate polygons and place markers, which are created for each coordinate pair. In step 5070, the polygon is generated with place marks from the results and displayed on the GIS application. In step 5080, the user can select a different view direction from the floor by selecting another coordinate point. This last may be accomplished by using a secondary map that need only display 2-dimensional data. The appropriate place markers representing the floor and direction are selected and a database request containing the direction and floor camera view is sent to the database which in step 5090 returns the stored floor camera view.

One skilled in the art would appreciate that mere variation of programming languages, methodologies and variable names while using the same algorithmic and procedural constructs still falls within the scope of the patent claims. Many modifications and other embodiments of the invention will come to the mind of a person skilled in the art having the benefit of the teachings presented in the foregoing description and associated drawings. Therefore, it is understood that the invention is not to be limited to the specific embodiment disclosed, and that modifications and embodiments are intended to be included within the scope of the appended claims.

Figure 13:
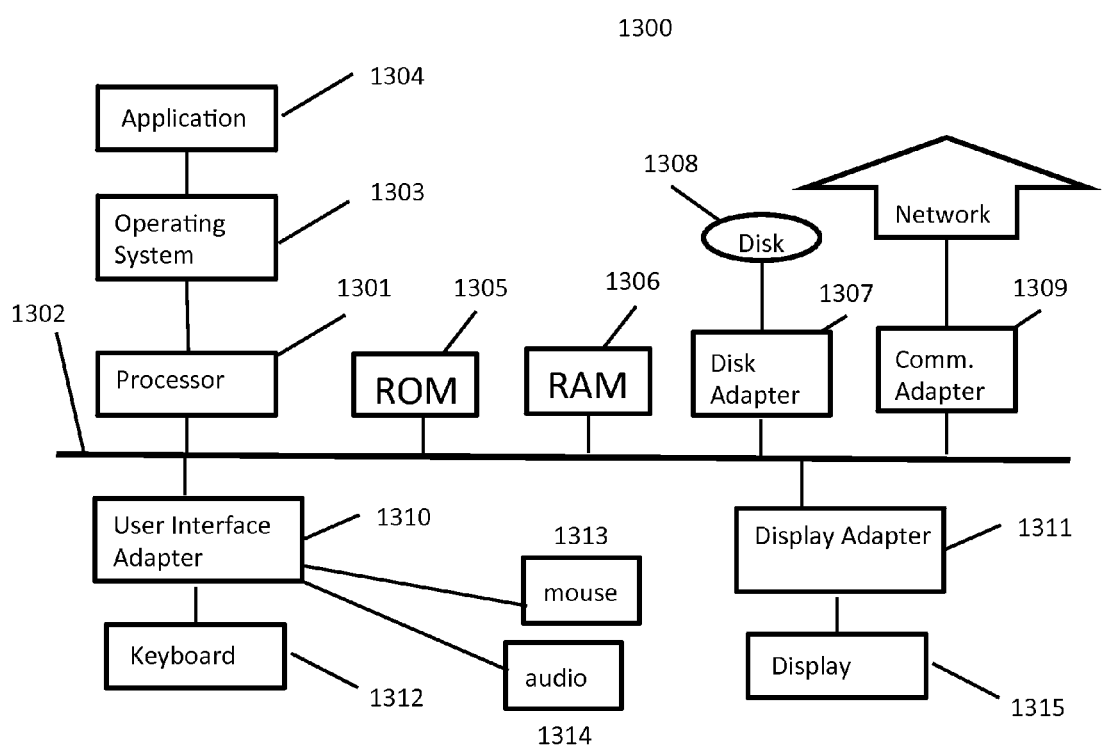
FIG. 13 shows a hardware diagram of a computer system, in accordance with an embodiment of the present invention.

FIG. 13 depicts an embodiment of a hardware configuration of a system 1300 which is representative of a hardware environment for practicing the present invention. Referring to FIG. 13, computer system 1300 has a processor 1301 coupled to various other components by system bus 1302. An operating system 1303 may run on processor 1301 and provide control and coordinate the functions of the various components of FIG. 13. An application 1304 in accordance with the principles of the present invention may run in conjunction with operating system 1303 and provide calls to operating system 1303 where the calls implement the various functions or services to be performed by application 1304. Application 1304 may include, for example, an application for creating and linking 3D spatial objects with dynamic data and visualizing said objects as discussed above.

Referring again to FIG. 13, read-only memory ("ROM") 1305 may be coupled to system bus 1302 and include a basic input/output system ("BIOS") that controls certain basic functions of computer system 1300. Random access memory ("RAM") 1306 and disk adapter 1307 may also be coupled to system bus 1302. It should be noted that software components including operating system 1303 and application 1304 may be loaded into RAM 1306, which may be computer system's 1300 main memory for execution. Disk adapter 1307 may be an integrated drive electronics ("IDE") adapter that communicates with a disk unit 1308, e.g., disk drive.

Computer system 1300 may further include a communications adapter 1309 coupled to bus 1302. Communications adapter 1309 may interconnect bus 1302 with an outside network (not shown) thereby allowing computer system 1300 to communicate with other similar devices.

I/O devices may also be connected to computer system 1300 via a user interface adapter 1310 and a display adapter 1311. Keyboard 1312, mouse 1313 and audio (speaker) 1314 may all be interconnected to bus 1302 through user interface adapter 1310. A display monitor 1315 may be connected to system bus 1302 by display adapter 1311. In this manner, a user is capable of inputting to computer system 1300 through keyboard 1312 or mouse 1313 and receiving output from computer system 1300 via display 1315 or speaker 1314.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," 'module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the C programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the present invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the function/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the function/acts specified in the flowchart and/or block diagram block or blocks.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for creating, linking and displaying a three-dimensional spatial object, the method comprising:
    generating a multi-geometry string specifying one or more outline characteristics;
    retrieving building class data from a database;
    assigning a different style to each building class of said building class data as an assigned style;
    retrieving floor data for each floor of one or more buildings;
    generating multi-geometry polygons for each building of the one or more buildings to generate a wire structure and associating each building of the one or more buildings with said assigned style using the floor data;
    generating a ring for each floor by linking two or more points each located by latitude, longitude and altitude, wherein the ring is associated with the data for each floor;
    generating a string of said multi-geometry polygons and styles;
    generating a spatial object from said string; and
    displaying the spatial object into a graphical information system wherein the spatial object is shown in a context of a local environment, and wherein the spatial object and ring are viewable in three dimensions.

2. The method of claim 1 further comprising using an overlay file to reduce the significance of the background.

3. The method of claim 1 wherein the wire structure is colored based on characteristics of a floor or a building.

4. The method of claim 1 wherein the spatial object is an accurate representation of an exterior shape of a building or structure and comprises:
    a. geographically and proportionally accurate wire-frame models of the exterior shape of the building or structure; and
    b. geographically and proportionally accurate individual floors that are nested within the wire-frame models wherein each individual floor is an independent nested spatial object.

5. The method of claim 1 further comprising the step of generating a visual flight between geographic points.

6. The method of claim 5 further comprising the steps of:
    a. receiving a Globally Unique Identifier that is passed to the database;
    b. receiving from the database data associated with all of said geographical points including building identification data;
    c. determining a start and end point for the visual flight;
    d. creating structures associated with the several geographical points from the data received using a CPU;
    e. retrieving camera views for start and end point of the flight; and
    f. generating and assembling the flight using the CPU and a Geographical Information System Application Programming Interface.

7. The method of claim 6 wherein the Globally Unique Identifier is contained within a URL.

8. The method of claim 6 wherein the geographical points are leases, and the building identification data is leasing data.

9. The method of claim 6 wherein the structures are rings and balloons adjacent to the rings contain data associated with the rings.

10. The method of claim 6 further comprising the steps of pausing the flight and replaying the flight.

* * * * *